United States Patent
Wuidart et al.

(10) Patent No.: US 6,937,049 B2
(45) Date of Patent: Aug. 30, 2005

(54) PARALLEL TESTING OF INTEGRATED CIRCUITS

(75) Inventors: Sylvie Wuidart, Pourrieres (FR); Claude Zahra, Allauch (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/766,333

(22) Filed: Jan. 28, 2004

(65) Prior Publication Data

US 2004/0193978 A1 Sep. 30, 2004

(30) Foreign Application Priority Data

Jan. 28, 2003 (FR) .............................. 03 00934

(51) Int. Cl.$^7$ .............................................. G01R 31/26
(52) U.S. Cl. ..................................................... 324/765
(58) Field of Search .............................. 324/765, 537, 324/158.1, 523, 527, 528, 533, 602, 605, 612, 667, 674

(56) References Cited

U.S. PATENT DOCUMENTS

| 5,996,099 A | | 11/1999 | Fournel et al. |
|---|---|---|---|
| 6,047,019 A | * | 4/2000 | Ishii .......................... 375/148 |
| 6,359,826 B1 | * | 3/2002 | Kim ...................... 365/230.03 |
| 6,466,007 B1 | | 10/2002 | Prazeres da Costa et al. |
| 2002/0176288 A1 | | 11/2002 | Nozuyama |

* cited by examiner

Primary Examiner—Vinh Nguyen
Assistant Examiner—Trung Q. Nguyen
(74) Attorney, Agent, or Firm—Lisa K. Jorgenson; James H. Morris; Wolf, Greenfield & Sacks, P.C.

(57) ABSTRACT

A method for testing in parallel several identical integrated circuit chips with an asynchronous operation, via two physical contacts between a tester and each of the chips, including transmitting on the tester side a first test control signal for the integrated circuit chips, having the test executed in desynchronized fashion by each of the integrated circuit chips, transmitting on the tester side, after a predetermined time interval following the transmission of the first control signal, a second result request control signal to the integrated circuit chips, and having all chips respond synchronously upon reception of said second control signal.

12 Claims, 2 Drawing Sheets

PARALLEL TESTING OF INTEGRATED CIRCUITS

BACKGROUND OF THE INVENTION

1. Field of the Invention

The present invention relates to the testing of integrated circuits and, more specifically, to the functional testing of integrated circuit chips by means of two physical contact points, generally by devices of tip board type. The present invention more specifically relates to the testing of contactless transponder integrated circuits intended for so-called secure applications where circuits internal to the chip operate asynchronously with respect to its outer environment.

2. Discussion of the Related Art

FIG. 1 shows, in a simplified view and in the form of blocks, an example of a conventional test of an integrated circuit 1. Such a tester comprises a contacting element 2 provided with two points 3, 4 of connection to pads corresponding to the integrated circuit chip. Chip 1 rests upon a support 5 of the tester and tip board 2 communicates with a central unit (UC) 6 of the test system.

FIG. 2 very schematically shows in the form of blocks a chip 1 of the type to which the present invention applies. Chip 1 comprises an area 2 comprising the processing circuits linked to the application and two input/output pads 11, 12 of this area. Pads 11 and 12 are more specifically intended to be subsequently connected to the ends of an inductive winding taking part in a resonant circuit, generally parallel, in an application to an electromagnetic transponder. The functional test to which the present invention relates includes of testing the circuit before assembly with its resonant circuit.

The functional testing, also called radiofrequency mode testing, is generally performed by using pads 11 and 12 for points 3 and 4 of the tester.

In so-called non-secure applications, a functional testing is generally carried out by connecting several integrated circuits in parallel. Such a testing is thus carried out by integrated circuit wafer, before cutting.

In so-called secure applications, a specific problem is that the operation of integrated circuit chips is voluntarily desynchronized to prevent piracies based on a synchronized operation, based on a clock external to the chip, of secret quantities or secret algorithms contained by the chips. The chips thus all respond with variable non-predictable delays to control signals received on their respective pads 11 and 12. Such a characteristic of secure products prevents parallel tests of several chips, which considerably increases the duration of testing.

SUMMARY OF THE INVENTION

The present invention aims at providing a novel integrated circuit chip testing method which overcomes at least some disadvantages of known solutions.

The present invention more specifically aims at providing an integrated circuit chip testing method, processing several identical chips in parallel even though these chips are intended for a desynchronized operation.

The present invention also aims at providing a solution compatible with the current structure of integrated circuit chips and of testers, and especially which does not require access to an additional pad with respect to the two pads conventionally used.

The present invention also aims at providing a solution which is compatible with conventional exploitations made of chip-by-chip test results.

To achieve these and other objects, the present invention provides a method for testing, in parallel, several identical integrated circuit chips with an asynchronous operation, via two physical contacts between a tester and each of the chips, comprising the steps of:

transmitting on the tester side a first test control signal for the integrated circuit chips;

having the test executed in desynchronized fashion by each of the integrated circuit chips;

transmitting on the tester side, after a predetermined time interval following the transmission of the first control signal, a second result request control signal to the integrated circuit chips; and having all chips respond synchronously upon reception of said second control signal.

According to an embodiment of the present invention, the predetermined time interval is selected to be longer than the maximum execution time of the test steps by any integrated circuit chip.

According to an embodiment of the present invention, an integrated circuit chip receiving said first control signal sets, after desynchronized execution of the test steps, to a state ready to accept a synchronized answer control signal.

According to an embodiment of the present invention, the test is considered as being negative as soon as the expected binary answer differs from a predetermined data word stored on the tester side.

The present invention also provides a system for testing by twin-wire contact a set of identical integrated circuit chips in parallel fashion, comprising a plurality of physical contact pairs intended to contact pads of the respective chips; and a test device.

According to an embodiment of the present invention, each integrated circuit chip to be tested is capable of interpreting at least one control signal for switching to a synchronous operating mode.

The foregoing objects, features and advantages of the present invention, will be discussed in detail in the following non-limiting description of specific embodiments in connection with the accompanying drawings.

DETAILED DESCRIPTION

Figure 1:
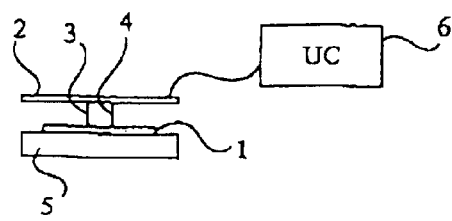
FIG. 1, previously described, schematically shows the structure of a test tool of the type to which the present invention applies.
Figure 2:
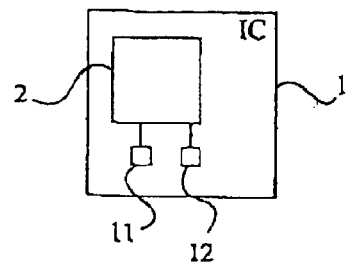
FIG. 2, previously described, is a simplified top view of an integrated circuit chip of the type to which the present invention relates.

The same elements have been designated with the same reference numerals in the different drawings. For clarity, only those elements that are necessary to the understanding of the present invention have been shown in the drawings and will be described hereafter. In particular, the internal structures of the circuits of the integrated circuit chip have not been detailed. Similarly, the actual testing steps have not been detailed, the present invention being compatible with conventionally-performed tests.

A feature of the present invention is to provide, on the integrated circuit chip side, a specific control signal allowing it to switch to a synchronous operating mode, this control signal being different from an actual synchronization signal (clock).

Another feature of the present invention is that the transmission of this specific control signal comes from the tester and is sent in parallel onto several chips.

Figure 3:
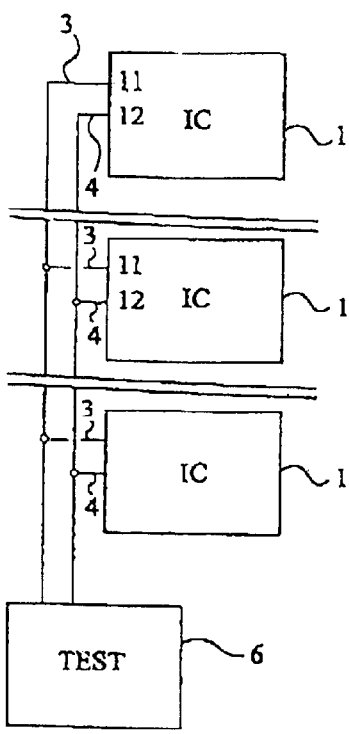
FIG. 3 shows, in the form of blocks, an embodiment of a parallel test system according to the present invention.

FIG. 3 illustrates, in the form of functional blocks, an embodiment of the present invention.

According to the present invention, several chips 1 are connected in parallel by pairs of respective points 3, 4 to a test device 6 (TEST). Thus, device 6 comprises as many contacts (tips) and inputs-outputs as there are chips to be processed in parallel.

Conventionally, the test which is desired to be performed on the chips is a functional test in radiofrequency mode, that is, test device 6 is intended to emulate the presence of a resonant circuit connected to terminals 11 and 12 of each integrated circuit 1.

Although this is not shown in the drawings, the test according to the present invention is more specifically intended to be performed on wafers, that is, before cutting of integrated circuit chips 1 for assembly either in cards, or in packages. The number of chips tested in parallel however does not necessarily correspond to the number of chips in a wafer.

Figure 4:
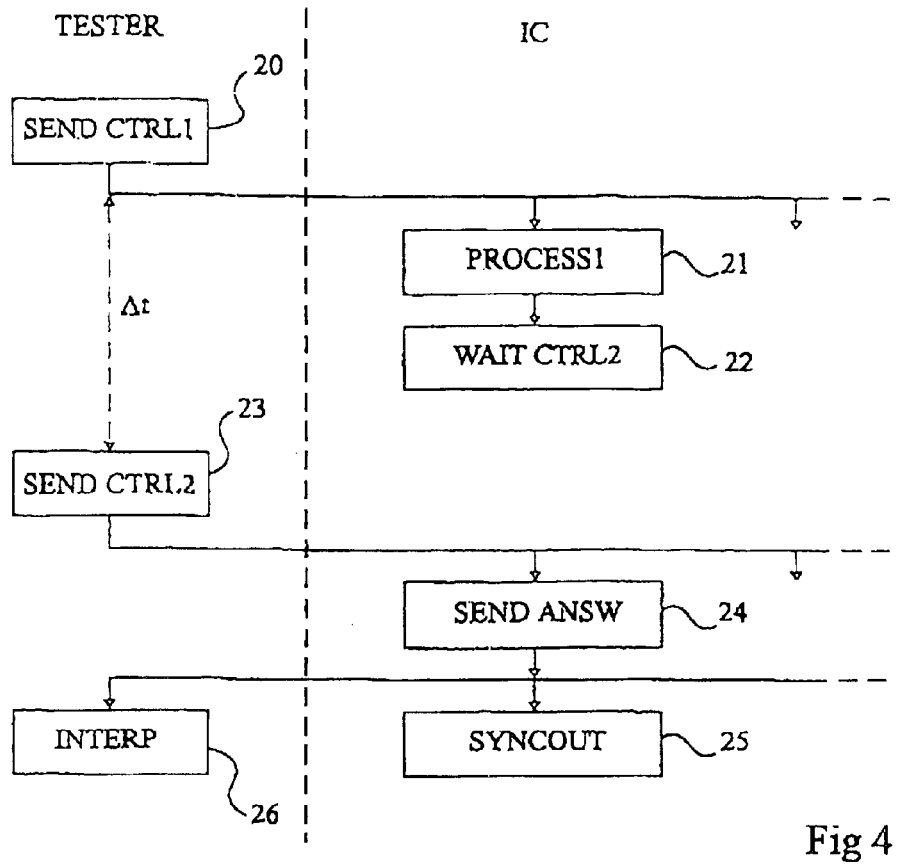
FIG. 4 illustrates an embodiment of the test method according to the present invention.

FIG. 4 illustrates an embodiment of the test method according to the present invention. This drawing shows in its left-hand portion the steps implemented on the tester side (TESTER) and on its right-hand side the steps implemented on the integrated circuit side (IC).

A test procedure starts according to the present invention with the sending of a control signal CTRL1 (block 20, SEND CTRL1) in parallel to all integrated circuit chips. Control signal CTRL1 is interpretable by the different integrated circuit chips as a test start control signal comprising, according to the present invention, a request for acceptation of a synchronous operation. On the side of chip 1, the actual test is performed (block 21, PROCESS1) asynchronously (each chip being rated by its own clock) before the chips all set to wait for an answer request control signal coming from the tester (block 22, WAIT CTRL2).

The tester sends, to all chips and after expiry of a time interval At from step 20, an answer request (block 23, SEND CTRL2). Control signal CTRL2 arrives simultaneously on all chips which then respond synchronously (block 24, SEND ANSW) to the tester, that is, synchronized on the tester clock. As soon as they have answered, each of the chips leaves the synchronous operating mode (block 25, SYNC OUT).

On the tester side, the synchronously-received answers are interpreted (block 26, INTERP). Since the tester has as many inputs-outputs as it can test chips per batch, the answers received in parallel are interpreted for the different chips which are recognizable (for example, by their position in the batch). In practice, the testing of a chip is considered as being negative as soon as the expected binary answer differs from a predetermined data word stored on the tester side. Since this is an operation verification test, it is enough for one of the chips not to operate properly for it to be declared faulty and to undergo an adequate rejection procedure.

The batch processing enables saving significant time with respect to a series testing since it is performed in parallel on all chips in the batch. All the defective chips are identified and eliminated as with a conventional rejection procedure.

Figure 5:
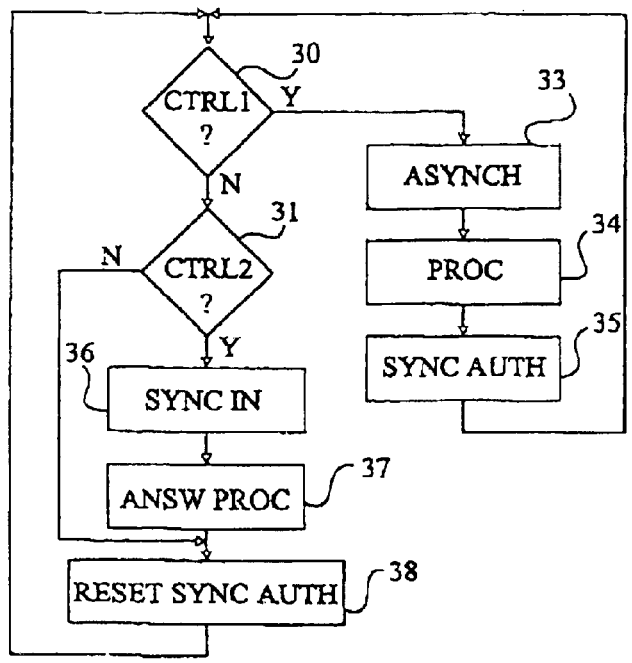
FIG. 5 shows the processings performed, on the tested integrated circuit side.

FIG. 5 illustrates the implementation of the test method of the present invention on the integrated circuit chip side.

When supplied, the integrated circuit chip of a transponder expects to receive a control signal and to interpret it. The supply conventionally comes from the electromagnetic radiation of a read/write terminal in the case of a contactless transponder. This especially is one of the functions of the resonant circuit, which is to capture this power. In a test phase, the power is provided similarly by a remote supply carrier by means of contacts 3 and 4.

In its waiting phase, the chip periodically tests the reception of a control signal CTRL1 (block 30, CTRL1?). It is considered that the selection of the test mode has already been performed upstream and only the instructions likely to occur in test mode are thus considered hereafter.

If the result of test 30 indicates the presence of test instruction CTRL1, the integrated circuit chip sets, as by default, to an asynchronous operating mode (block 33, ASYNCH). Then, the provided test procedure is executed under the action of control signal CTRL1 (block 34, PROC). Finally, it sets to a state capable of accepting a synchronization of its operation (block 35, SYNC AUTH). The chip then sets back to wait for a new instruction.

If a control signal is received, but not instruction CTRL1, the chip then tests whether it is instruction CTRL2 (block 31, CTRL2?).

In principle, the instruction received after an instruction CTRL1 is instruction CTRL2 transmitted by the tester (block 23, FIG. 4). Tests 30 and 31 are then respectively negative and positive. The chip then temporarily sets to a synchronous operating mode (block 36, SYNC IN) and synchronously sends answer ANSW to the performed test of instruction CTRL1 (block 37, ANSW PROC). As soon as it has transmitted answer ANSW, the chip resets the authorization for switching to the synchronous mode (block 38, RESET SYNC AUTH) and returns to the waiting for a next instruction.

If for any reason, the instruction following instruction CTRL1 is not instruction CTRL2, test 31 is negative. This means that the test mode has been left and the chip then does not set to synchronous mode. It directly goes to block 38, that is, it resets the authorization for switching to the synchronous mode (block 38, RESET SYNC AUTH) before returning to waiting for a next instruction. The instruction is then processed in synchronous mode as with a conventional instruction.

Similarly, if a control signal CTRL2 is received but it does not follow an instruction CTRL1, test 31 will be positive. However, since the switching to the synchronous mode has not been allowed by procedure 35, step 36 will be of no effect. Accordingly, there will be no synchronous sending of the chip answer.

An advantage of the present invention is that it respects the secure execution (in asynchronous operation) of the actual test. Indeed, only after the test procedures (block 34, FIG. 5) does the chip declare itself ready to accept a synchronous operation control signal. This control signal CTRL2, when received, allows it to synchronously transmit the answer to the test.

It should be recalled that, by default, all processings within a chip of the type to which the present invention applies are processings which are performed in desynchronized fashion, that is, with no link with an external clock.

According to the present invention, only at the end of control signal CTRL2 does the chip switch to a synchronous mode, that is, a mode depending on the external clock.

An advantage of the present invention is that it enables processing several chips in parallel with the test procedure, while respecting a desynchronized processing of the test.

The duration of delay Δt of waiting by the tester between the transmissions of the two control signals is predetermined and selected according to the possible maximum delay of processing of the test instruction by the chips to be tested.

Another advantage of the present invention is that it is perfectly compatible with conventional test procedures and with conventional integrated circuit structures. Indeed, for its implementation, the present invention only requires, from the integrated circuit chip, the understanding of a specific control signal (CTRL2) allowing it to switch to a synchronous operating mode.

Generally, integrated circuit chips to be tested to which the present invention applies are equipped with microcontrollers capable of interpreting different control signals. It is then enough to add a control signal understandable by these microcontrollers.

The practical implementation of the present invention is within the abilities of those skilled in the art based on the functional indications given hereabove. In particular, the modifications to be brought to the integrated circuit chips to be tested according to the needs of the present invention, like for example the addition of a register containing the synchronization authorization indicator (block 35, FIG. 5), are within the abilities of those skilled in the art. Further, the determination of the number of chips per batch is within the abilities of those skilled in the art, taking into account, especially, the tester (its capacities of processing the different tests in parallel), the tip board, and the chip size.

Of course, the present invention is likely to have various alterations, modifications, and improvement which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for testing in parallel several identical integrated circuit chips with an asynchronous operation, via two physical contacts between a tester and each of the chips, comprising:

transmitting on the tester side a first test control signal for the integrated circuit chips;

having the test executed in desynchronized fashion by each of the integrated circuit chips;

transmitting on the tester side, after a predetermined time interval following the transmission of the first control signal, a second result request control signal to the integrated circuit chips; and having all chips respond synchronously upon reception of said second control signal.

2. The method of claim 1, wherein the predetermined time interval is selected to be longer than the maximum execution time of the test steps by any integrated circuit chip.

3. The method of claim 1, wherein an integrated circuit chip receiving said first control signal sets, after desynchronized execution of the test steps, to a state ready to accept a synchronized answer control signal.

4. The method of claim 1, wherein the test is considered as being negative as soon as the expected binary answer differs from a predetermined data word stored on the tester side.

5. A system for testing by twin-wire contact a set of identical integrated circuit chips in parallel fashion, comprising:

a plurality of physical contact pairs intended to contact pads of the respective chips; and a device capable of implementing the method of claim 1.

6. The system of claim 5, wherein each integrated circuit chip to be tested is capable of interpreting at least one control signal to switch to a synchronous operating mode.

7. A method for testing in parallel several integrated circuit chips designed for asynchronous operation, using two physical contacts between a tester and each of the chips, comprising:

transmitting, from the tester a first test control signal to the integrated circuit chips;

having the test executed by each of the integrated circuit chips without the synchronizing operation of the integrated circuit chips;

transmitting, from the tester, after a time interval following the transmission of the first test control signal, a second result request control signal to the integrated circuit chips; and having all chips respond synchronously upon reception of said second control signa.

8. The method of claim 7, wherein the time interval is selected to be longer than the maximum execution time of the test steps by any integrated circuit chip.

9. The method of claim 7, wherein an integrated circuit chip receiving said first control signal sets, after execution of the test steps, to a state ready to accept a synchronized answer control signal.

10. The method of claim 7, wherein the test is considered as being negative as soon as the expected binary answer differs from a data word stored on the tester side.

11. A system for testing a set of identical integrated circuit chips in parallel, comprising:

a plurality of physical contact pairs intended to contact pads of the respective chips; and a device capable of:

transmitting, from the tester a first test control signal to the integrated circuit chips;

having the test executed by each of the integrated circuit chips without synchronizing operation of the integrated circuit chips;

transmitting, from the tester, after a time interval following the transmission of the first test control signal, a second result request control signal to the integrated circuit chips; and having all chips respond synchronously upon reception of said second control signal.

12. The system of claim 11, wherein each integrated circuit chip to be tested is capable of interpreting at least one control signal to switch to a synchronous operating mode.

* * * * *

UNITED STATES PATENT AND TRADEMARK OFFICE
CERTIFICATE OF CORRECTION

PATENT NO. : 6,937,049 B2
DATED : August 30, 2005
INVENTOR(S) : Sylvie Wuidart and Claude Zahra It is certified that error appears in the above-identified patent and that said Letters Patent is hereby corrected as shown below:

Column 3,
Line 45, should read:
-- interval Δt from step 20, an answer request (block 23, SEND --.

Column 6,
Line 32, should read:
-- said second control signal --.
Lines 43-48, should read:
-- 11. A system for testing a set of identical integrated circuit chips in parallel, comprising:
 a plural of physical contact pairs intended to contact pads of the respective chips; and for
 transmitting, from a tester a first test control signal to --.

Signed and Sealed this

Eighth Day of November, 2005

JON W. DUDAS
*Director of the United States Patent and Trademark Office*